United States Patent [19]

Sato et al.

[11] Patent Number: 5,334,826

[45] Date of Patent: Aug. 2, 1994

[54] METHOD AND APPARATUS FOR EXTENDING AND CONFIRMING THE SERVICE LIFE OF SEMICONDUCTOR LASER OF BAR CODE READER BY DETECTING CURRENT INCREASE CORRESPONDING TO TEMPERATURE OF SEMICONDUCTOR LASER

[75] Inventors: Shinichi Sato; Hiroaki Katoh, both of Kawasaki, Japan

[73] Assignee: Fujitsu Limited, Kanagawa, Japan

[21] Appl. No.: 880,025

[22] Filed: May 8, 1992

[30] Foreign Application Priority Data

May 10, 1991 [JP]  Japan ................................ 3-105293

[51] Int. Cl.⁵ .............................................. G06K 7/10
[52] U.S. Cl. ................................ 235/455; 235/472; 372/29; 372/31
[58] Field of Search ................. 235/455, 472; 372/29, 372/31

[56] References Cited

U.S. PATENT DOCUMENTS

| | | | |
|---|---|---|---|
| 4,267,439 | 5/1981 | Thomas et al. | 235/455 |
| 4,567,360 | 1/1986 | Yamada | 235/455 |
| 4,639,606 | 1/1987 | Boles et al. | 235/455 |
| 5,019,769 | 5/1991 | Levinson | 372/29 |
| 5,179,269 | 1/1993 | Horie et al. | 235/455 |

FOREIGN PATENT DOCUMENTS

| | | |
|---|---|---|
| 0287360 | 10/1988 | European Pat. Off. . |
| 243147 | 2/1987 | Fed. Rep. of Germany . |
| 3706635 | 9/1988 | Fed. Rep. of Germany . |
| 0102885 | 8/1979 | Japan .................................... 372/29 |
| 55-12155 | 9/1980 | Japan . |
| 55-130190 | 10/1980 | Japan . |
| 0153786 | 11/1981 | Japan .................................... 372/29 |
| 58-134668 | 8/1983 | Japan . |
| 60-49690 | 3/1985 | Japan . |
| 4-184582 | 7/1992 | Japan . |
| 2045516 | 10/1980 | United Kingdom . |
| 2234626 | 2/1991 | United Kingdom . |
| 8900778 | 1/1989 | World Int. Prop. O. ........... 372/29 |
| 9205515 | 4/1992 | World Int. Prop. O. .......... 235/455 |

*Primary Examiner*—Harold Pitts
*Attorney, Agent, or Firm*—Staas & Halsey

[57] ABSTRACT

A semiconductor laser control method and apparatus includes a semiconductor laser, a semiconductor laser control circuit, a drive current measuring unit, a detection unit, a warning unit, and a memory unit. The memory unit stores initial drive current values and corresponding temperatures. The detection unit performs a step of comparing an actual drive current value measured by the drive current measuring unit with the initial drive current value corresponding to an actual temperature. The warning unit performing a step of generating an alarm predicting the expiration of service life of the semiconductor laser, when the actual drive current value exceeds the corresponding initial drive current value by a specified percentage. Consequently, the near expiration of the service life of the semiconductor laser can be confirmed and therefore render the operational effects such as replacement of the semiconductor laser, without causing any hindrance to the operation.

30 Claims, 11 Drawing Sheets

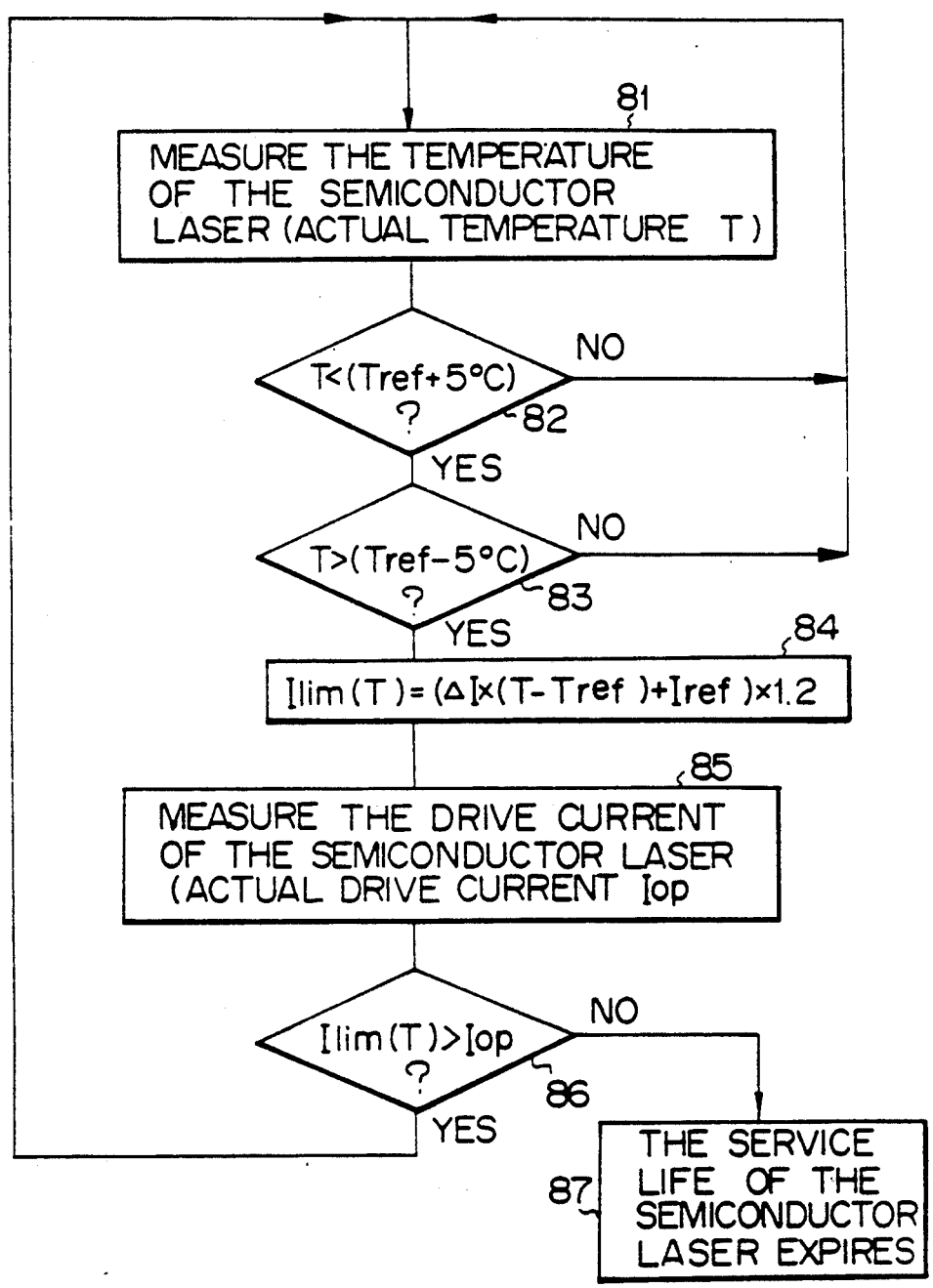

METHOD AND APPARATUS FOR EXTENDING AND CONFIRMING THE SERVICE LIFE OF SEMICONDUCTOR LASER OF BAR CODE READER BY DETECTING CURRENT INCREASE CORRESPONDING TO TEMPERATURE OF SEMICONDUCTOR LASER

BACKGROUND OF THE INVENTION

1. Field of the Invention

The present invention relates to a semiconductor laser control apparatus, more particularly, to a semiconductor laser control apparatus for confirming the service life of a semiconductor laser by detecting the current increase of the semiconductor laser from an initial state thereof.

2. Description of the Related Art

Recently, bar codes have been used in various industrial fields as represented by point-of-sale (POS) systems employed in distribution businesses to provide bar code readers with compact, inexpensive and with low power consumption features. Semiconductor lasers have mainly been used for POS systems rather than gas lasers.

However, the service life of a semiconductor laser is relatively short, and when the POS system becomes inoperatable because of expiration of the service life, the operation performed by the POS system stops. Note, the service life of the semiconductor laser varies greatly with the individual semiconductor laser, and further the service life of the semiconductor laser varies greatly with the conditions (especially, temperature) of the POS system using the semiconductor laser. Concretely, the service life of a semiconductor laser is, for example, 4000~7000 hours under continuous operation at 50° C., but the service life of the same semiconductor laser is, for example, two times higher (8000~14000 hour under continuous operation at 40° C.

Therefore, it has been desired to make it possible to replace the semiconductor laser by predicting the expiration of its service life before a failure of operation and to extend the time of operation until such inactivity. Note, as described above, the service life of the semiconductor laser varies greatly with the individual semiconductor laser and the temperature of the POS system using the semiconductor laser.

Note, the configuration of a semiconductor laser control apparatus to prolong the service life thereof is proposed by some inventors including the inventors (the same applicant, or asignee) of this application under Japanese Patent Application NO. 02-314606 (which corresponds to U.S. patent application No. 07/794,226). Further, an example of the POS system, or a bar code reader using the semiconductor laser control apparatus is also described in JPPA,606.

SUMMARY OF THE INVENTION

An object of the present invention is to provide a semiconductor laser control apparatus that allows replacement of the semiconductor laser at an appropriate time before failure of operation by predicting the expiration of the service life of the semiconductor laser.

According to the present invention, there is provided a semiconductor laser control apparatus comprising: a semiconductor laser; a semiconductor laser control circuit for controlling a drive current of the semiconductor laser to output a specific light quantity from the semiconductor laser; a drive current measuring unit for measuring a drive current of the semiconductor laser; a memory unit for storing at least one initial drive current values of the semiconductor laser for the specific light quantity and corresponding temperatures of the initial drive current values; a detection unit for comparing an actual drive current value of the semiconductor laser measured by the drive current measuring unit with the initial drive current value corresponding to an actual temperature when the actual drive current is measured; and a warning unit for generating an alarm of a prediction of the expiration of service life of the semiconductor laser, when the actual drive current value exceeds the corresponding initial drive current value by a specified percentage.

The semiconductor laser control apparatus may further comprise a temperature measuring unit for measuring a temperature of the semiconductor laser. The memory unit may store a plurality of initial drive current values of the semiconductor laser and corresponding temperatures of each of the initial drive current values. The memory unit may store one initial drive current value of the semiconductor laser and a corresponding temperature of the initial drive current value. Further, the memory unit may be constituted by an EEPROM or EPROM.

The semiconductor laser and the memory unit may be provided in the same package. The detection unit may include: a first drive unit for controlling the lighting with a first light quantity; and a second drive unit for controlling the lighting with a second light quantity less than the first light quantity, and switching over the first drive unit to the second drive unit, when the actual drive current value is increased by a specified percentage over the corresponding initial current value while the lighting is controlled by the first drive unit.

The semiconductor laser control apparatus may repeat switching ON and OFF of the semiconductor laser at a specified ratio, continuously remain on when a specified information is detected in a reflection light from an object to be radiated and repeats lighting and extinguishing at the specified ratio when the following information is not detected even after a first time being passed from an information detection timing, and the time setting is changed from the first time to a second time shorter than the first time when the drive current value is increased by a specified percentage over the initial drive current value at the corresponding temperature.

Further, according to the present invention, there is provided a semiconductor laser control apparatus repeating lighting and extinguishing of a semiconductor laser at a specified ratio, continuously remaining ON when specified information is detected in reflected light from an object to be radiated, and repeating lighting and extinguishing at the specified ratio when the specified information is not detected even after the specified time has passed from the information detection timing, wherein the semiconductor laser control apparatus comprises: a first drive unit for controlling the lighting of the semiconductor laser with a first light quantity; a second drive unit for controlling the lighting of the semiconductor laser with a second light quantity larger than the first light quantity; and a control unit for controlling the lighting by the first drive unit in continuous lighting and changing over to the second drive unit in repetition of lighting and extinguishing.

Furthermore, according to the present invention, there is provided a bar code reader device, for reading the data of a bar code label and supplying the data to a point-of-sale terminal, having a semiconductor laser control apparatus, wherein the semiconductor laser control apparatus comprises: a semiconductor laser; a semiconductor laser control circuit for controlling a drive current of the semiconductor laser to output a specific light quantity from the semiconductor laser; a drive current measuring unit for measuring a drive current of the semiconductor laser; a memory unit for storing at least one initial drive current value of the semiconductor laser for the specific light quantity and corresponding temperatures of the initial drive current values; a detection unit for comparing an actual drive current value of the semiconductor laser measured by the drive current measuring unit with the initial drive current value corresponding to an actual temperature when the actual drive current is measured; and a warning unit for generating an alarm of a prediction of the expiration of service life of the semiconductor laser, when the actual drive current value exceeds the corresponding initial drive current value as much as a specified percentage.

In addition, according to the present invention, there is also provided a bar code reader device, for reading the data of a bar code label and supplying the data to a point-of-sale terminal, having a semiconductor laser control apparatus repeating lighting and extinguishing of a semiconductor laser at a specified ratio, continuously remaining ON specified information is detected in a reflected light from an object to be radiated, and repeating lighting and extinguishing at the specified ratio when the specified information is not detected even after the specified time has passed from the information detection timing, wherein the semiconductor laser control apparatus comprises: a first drive unit for controlling the lighting of the semiconductor laser with a first light quantity; a second drive unit for controlling the lighting of the semiconductor laser with a second light quantity larger than the first light quantity; and a control unit for controlling the lighting by the first drive unit in continuous lighting and changing over to the second drive unit in repetition of lighting and extinguishing.

BRIEF DESCRIPTION OF THE DRAWINGS

The present invention will be more clearly understood from the description of the preferred embodiments as set forth below with reference to the accompanying drawings, wherein:

FIG. 8 is a flow chart showing an example of a laser control operation carried out in the semiconductor laser control apparatus according to the present invention;

DESCRIPTION OF THE PREFERRED EMBODIMENTS

For a better understanding of the preferred embodiments, the problems of the related art will be explained, with reference to FIGS. 1 to 4.

Figure 1:
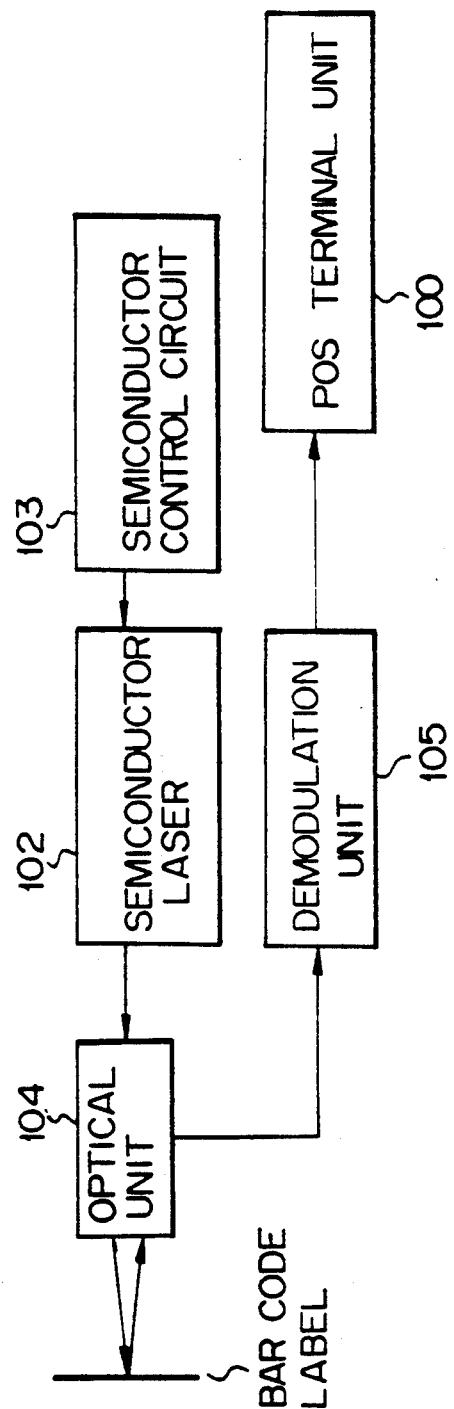
FIG. 1 is a schematic block diagram showing an example of a bar code reader device using the semiconductor laser control apparatus.

FIG. 1 shows an example of a bar code reader device using the semiconductor laser control apparatus.

In FIG. 1, reference numeral 100 denotes a POS terminal unit, 102 denotes a semiconductor laser, 103 denotes a semiconductor laser control circuit, 104 denotes an optical unit, and 105 denotes a demodulation unit.

As shown in FIG. 1, data on a bar code label is detected by the optical unit 104 and supplied to the POS terminal unit 100 through the demodulation unit 105. Note, an emitted light output from the semiconductor laser 102 is applied to the optical unit and used to read the data of the bar code label, and the semiconductor laser 102 is controlled by the semiconductor laser control circuit 103. Namely, a light quantity of the semiconductor laser 102 is controlled by adjusting a laser drive current in the semiconductor laser control circuit 103, so that a specific light quantity is output from the semiconductor laser 102 to the optical unit 104.

Figure 2A:
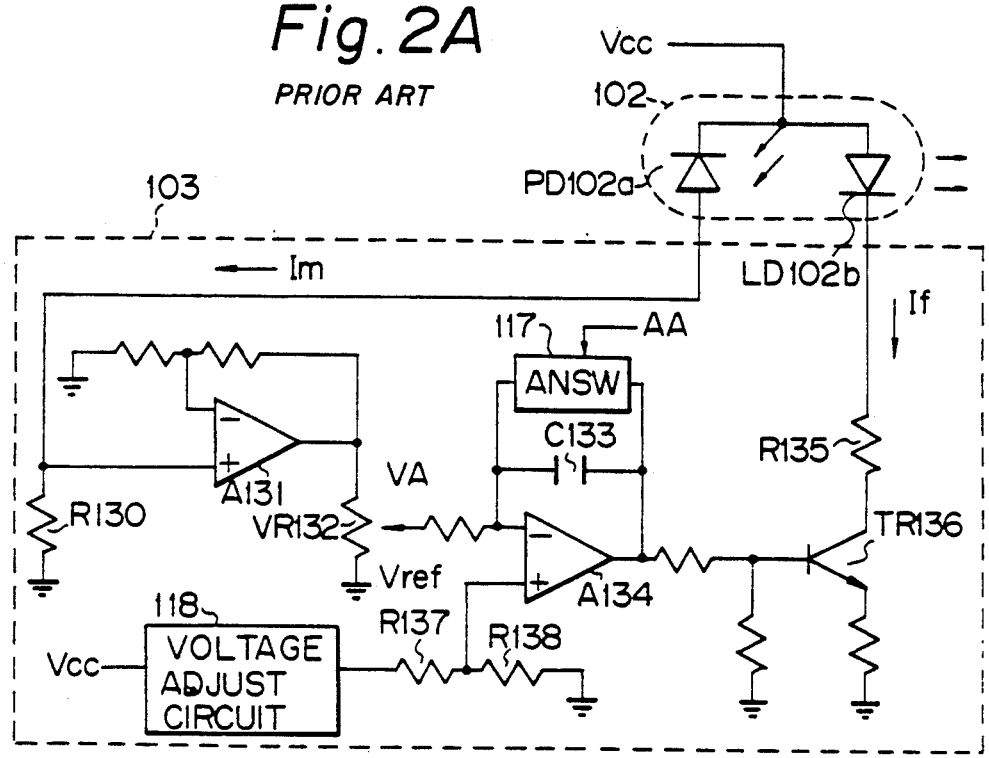
FIGS. 2A and 2B are circuit block diagrams showing an example of a semiconductor laser control apparatus according to the prior art.
Figure 2B:
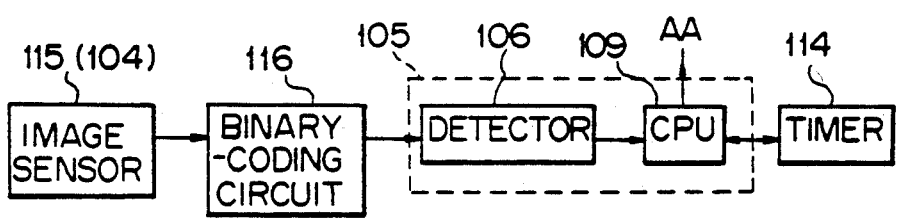

FIGS. 2A and 2B show an example of a semiconductor laser control apparatus according to the prior art.

As shown in FIG. 2A, the semiconductor laser 102 comprises a laser diode (LD) 102b and a photo diode (PD) 102a, and a drive current If of the laser diode 102b is controlled by a current Im of the photo diode 102a, corresponding to the light quantity of the laser diode 102b which is detected by the photodiode 102a, to maintain the light quantity of the semiconductor laser 102 at a fixed level.

In the semiconductor laser control circuit 103, the current Im is converted to a voltage by a resistor R130 and amplified by an operation amplifier A131, and then divided to a voltage VA corresponding to the specified light quantity by a variable resistor VR132. The voltage VA is compared with a reference voltage Vref generated from a voltage adjust circuit 118, resistors R137 and R138, and integrated by an operation amplifier A134. Further, the voltage VA after integration by the operation amplifier A134 is converted to the laser drive current If by the transistor TR136. Note, in the semiconductor laser control circuit 103, a reference numeral 117 denotes an analog switch (ANSW), and C133 denotes a capacitor connected in parallel to the analog switch 117.

Note, in FIG. 2B, reference numeral 115 denotes an image sensor provided in the optical unit 104, 116 denotes a binary-coding circuit, 106 denotes a detector, 109 denotes a central processing unit (CPU), and 114 denotes a timer. As shown in FIG. 2B, the demodulation unit 105 includes the detector 106 and the CPU 109, and a switching control signal AA is output from the CPU 109 to the analog switch 117. Namely, the analog switch 117 is controlled in accordance with the switching control signal AA output from the CPU 109.

Figure 3:
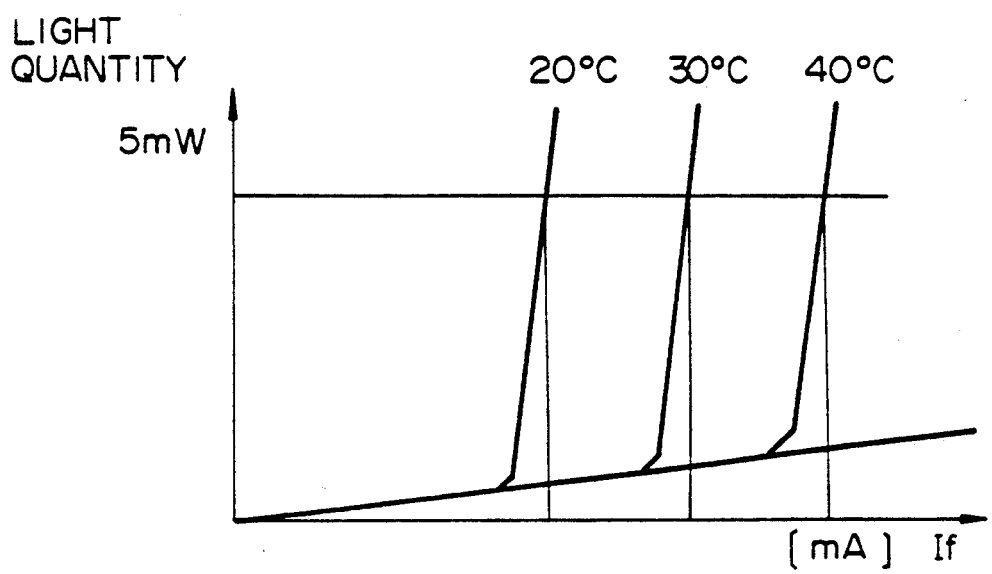
FIG. 3 is a diagram showing an example of emission characteristics of a semiconductor laser.

FIG. 3 shows an example of emission characteristics of a semiconductor laser.

As shown in FIG. 3, the light quantity is controlled to be fixed by the above control even though the temperature characteristic or the like varies. The light quantity of the semiconductor laser is set by the variable resistor VR132, so that the light quantity becomes the specified value.

Note, in this case, the analog Switch (ANSW) 117 is used to turn OFF the semiconductor laser 102 and to reduce the lighting time of the semiconductor laser 102 during operation by controlling ON/OFF operation of the analog switch 117. The configuration of this semiconductor laser control apparatus is proposed by some inventors including the same inventors (the same applicant, or asignee) of this application under Japanese Patent Application No. 02-314606 (which corresponds to U.S. patent application No. 07/794,226).

Figure 4:
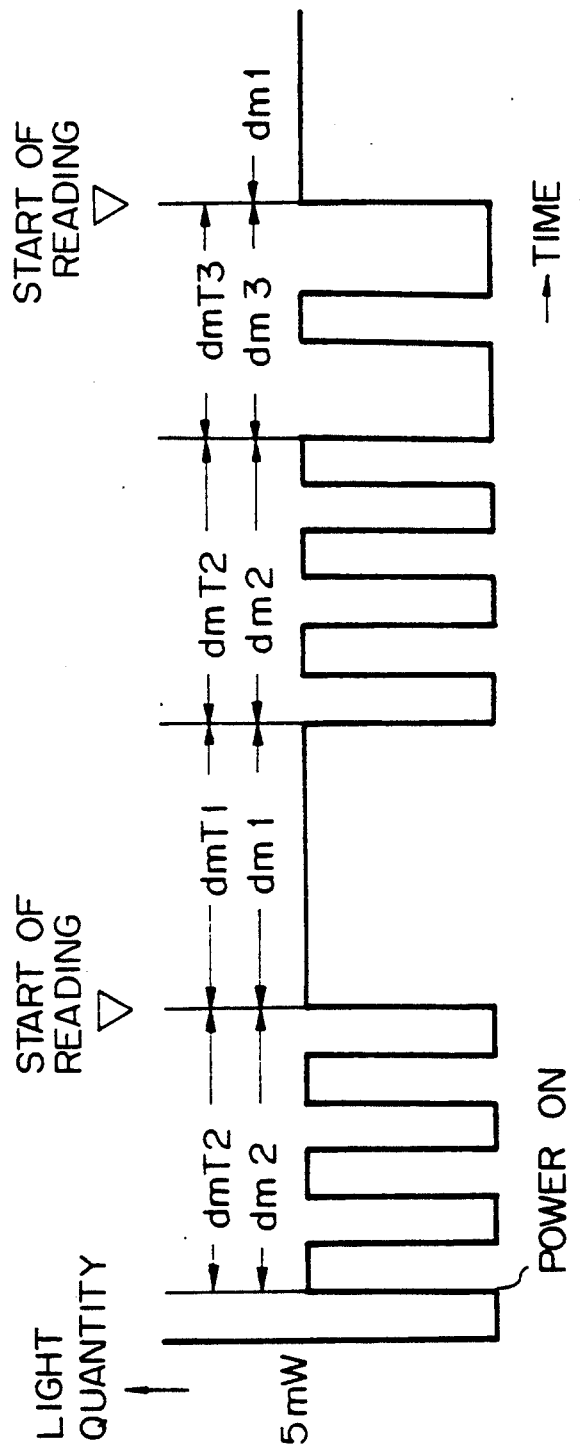
FIG. 4 is a timing chart for explaining a laser control operation in the semiconductor laser control apparatus according to the prior art.

FIG. 4 is a timing chart for explaining a laser control operation in the semiconductor laser control apparatus according to the prior art. As shown in FIG. 4, according to the proposal disclosed in JPA'606, a first mode dm1 for continuous lighting, second mode dm2 for repetitive lighting and extinguishing, and third mode dm3 for repetitive lighting and extinguishing with a lower lighting ratio than that of the second mode dm2 are set. Namely, in FIG. 4, the lighting mode is set to the first mode dm1 when a scan of a bar code label is detected (detection of the start of reading), the second mode dm2 when a next scan is not detected even after lapse of the specified time dmT1 in the first mode dm1, and the third mode dm3 when a scan is not detected even after lapse of the specified time dmT2 in the second mode dm2.

Note, the laser beam scans the same bar code label a plurality of times, and is set to the first mode dm1 when the start of scan is detected in the second and third modes dm2, dm3. Therefore, when the system is not used, the total lighting time is reduced by automatically setting the laser system to the ready condition when the lighting ratio (period) is low.

Further, in FIGS. 2A and 2B, reflection light received by the image sensor 115 is converted to an electric signal and binary-coded by the binary-coding circuit 116. When this binary-coded signal is detected as bar code information through identification of a guard bar by the detector 106, the CPU 109 starts the demodulation, sets the semiconductor laser 102 to the first mode dm1, and sets the subsequent lighting modes while monitoring the output of the timer 114. Note, the guard bar is positioned at both the start and end portion of each bar code label of the Universal Product Code (UPC) Standard. Further, in other bar code labels such as NW7, CODE-39, ITF, and the like, the guard bar may be called a start character, end character, and the like.

In the above description, the service life of the semiconductor laser (102) is relatively short and greatly varying in the individual semiconductor laser, and therefore it contrives to reduce the duration of lighting when the semiconductor laser is not being used during an operation as described above. When the system fails to operate because of expiration of the service life, the semiconductor laser should be replaced and the work will be hindered.

Namely, the service life of a semiconductor laser is relatively short, and when the system using the semiconductor laser (for example, a POS system) becomes inoperable because of expiration of the service life, the work using the POS system will stop. Note, the service life of the semiconductor laser varies greatly with the individual semiconductor laser, and further the service life of the semiconductor laser also varies by the circumstances (especially, temperature) of the POS system using the semiconductor laser. Therefore, it is necessary to replace the semiconductor laser by predicting the expiration of its service life before failure of operation and to extend the time of operation until such inactivity.

Below, the preferred embodiments of a semiconductor laser control apparatus according to the present invention will be explained, with reference to the accompanying drawings.

Figure 5:
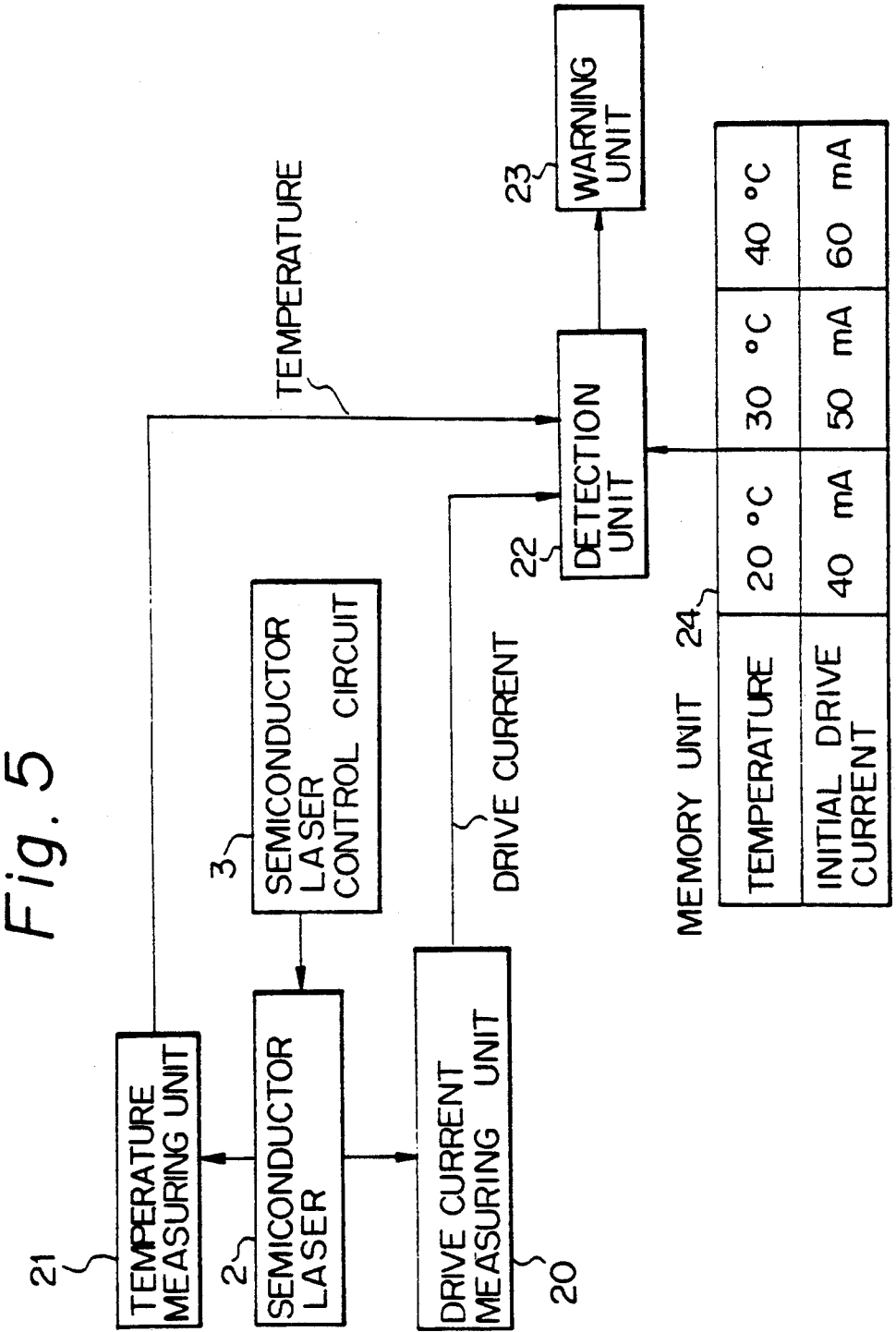
FIG. 5 is a block diagram showing a principle of a semiconductor laser control apparatus according to the present invention.

FIG. 5 shows a principle of a semiconductor laser control apparatus according to the present invention. In FIG. 5, reference numeral 2 denotes a semiconductor laser, 3 denotes a semiconductor laser control circuit, 20 denotes a drive current measuring unit, 21 denotes a temperature measuring unit, 22 denotes a detection unit, 23 denotes a warning unit, and 24 denotes a memory unit.

The semiconductor laser control circuit 3 is used to control a drive current of the semiconductor laser 2 to output a specified light quantity from the semiconductor laser 2. The drive current measuring unit 20 is used to measure the drive current (actual drive current I) of the semiconductor laser 2, and the temperature measuring unit 21 is used to measure the temperature (actual temperature T) of the semiconductor laser 2. The detection unit 22 is used to compare the actual drive current value detected by the drive current measuring unit 20 with the initial drive current value stored in the memory unit 24 corresponding to the temperature at the actual temperature detected by the temperature measuring unit 21. Concretely, for example, when the actual temperature (T) measured by the temperature measuring unit 21 is specified at 20° C., the actual drive current (Iop, If) detected by the drive current measuring unit 20 is compared with the initial drive current 40 mA at 20° C. which is previously stored in the memory unit 24. Further, for example, when the actual temperature is specified at 40° C., the actual drive current is compared with the initial drive current 60 mA at 40° C. previously stored in the memory unit 24. The warning unit 23 generates an alarm when the measured drive current value is increased by the specified percentage (for example, 20%) over the initial drive current value of the corresponding temperature.

Note, the above operation is carried out a predetermined time each day (for example, at the time of switching ON the POS system), every hour, or the like.

In the above description, the memory unit 24, which is, for example, an erasable programmable read only memory (EPROM) or electrically erasable programmable read only memory (EEPROM), stores a plurality of temperature data and the initial drive currents corresponding to the temperature data. Further, as shown in FIG. 5, the initial drive current values of the semiconductor laser 2 are different in accordance with the temperature. Furthermore, even though the temperatures of a plurality of semiconductor lasers are the same, the initial drive currents of the semiconductor lasers are different from each other, since temperature-drive current characteristics are quite different in individual semiconductor lasers. Consequently, the memory unit 24 for storing the initial drive current values and corresponding temperatures must be provided for each of the individual semiconductor lasers. Further, it is preferable to replace the semiconductor laser 2 of the POS system to provide the semiconductor laser 2 and the memory unit 24 in the same package.

Nevertheless, the memory unit 24 can store only one initial drive current (reference drive current $I_{ref}$) and corresponding temperature (reference temperature $T_{ref}$), and other initial drive currents corresponding to other temperatures can be calculated, which will be explained with reference to FIG. 8. In this case, the accuracy of the relationships between the temperatures and the initial drive currents may be decreased, and the actual temperature of the semiconductor laser may be limited to a small range (for example, $T_{ref} \pm 5°$ C.). In addition, the memory unit 24 can also store one initial drive current (reference drive current $I_{ref}$) and corresponding temperature (for example, 25° C.), and a plurality of temperature compensation values ($\Delta I$) and corresponding temperatures (for example, 30°, 35°, 40° C., ...). As described above, data stored in the memory unit 24 and the calculation manner for obtaining the initial current value at the actual temperature can be modified. Note, it is preferable to replace the semiconductor laser 2 of the POS system so that the semiconductor laser 2 and the memory unit 24 are provided in the same package.

Figure 6:
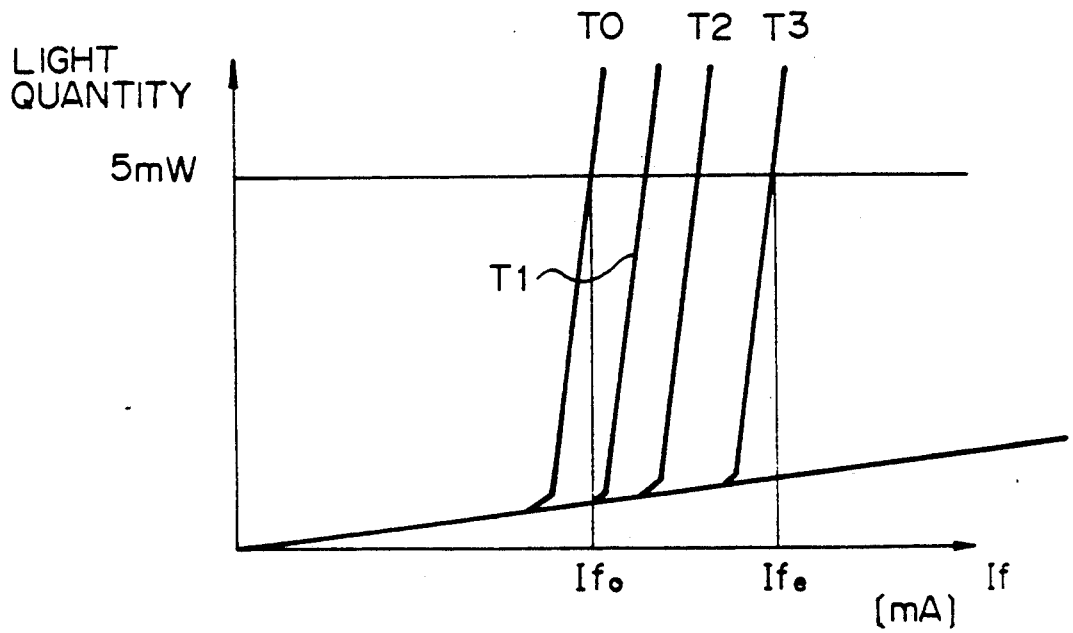
FIG. 6 is a diagram showing an example of emission characteristics of a semiconductor laser to explain the principle of the semiconductor laser control apparatus according to the present invention.

FIG. 6 is an example of emission characteristics of a semiconductor laser explaining the principle of the semiconductor laser control apparatus according to the present invention.

As shown in FIG. 6 (FIG. 3), the drive current of the semiconductor laser 2 is necessary for the specified quantity increases in accordance with the total lighting time, that is, the semiconductor laser and the semiconductor laser 2 finally fail to operate. Nevertheless, in the present invention, the temperature-drive current characteristics are used to confirm the service life of the semiconductor laser by detecting the current increase of the semiconductor laser from the initial state thereof.

Namely, in the present invention, the drive current value in the initial lighting of the semiconductor laser 2 ($If_o$ in FIG. 6) at a temperature TO is measured and stored in the memory unit 24. Further, an actual drive current value and an actual temperature of the semiconductor laser during the operation state is detected (measured) in a specific time interval by the drive current measuring unit 20, the temperature measuring unit 21 and the detection unit 22, and the detected drive current value is compared with the initial drive current value stored in the memory unit 24 corresponding to the actual temperature of the semiconductor laser 2. Note, as shown in FIG. 6, the drive current value varies with the temperature of the semiconductor laser 2 and also with each of the individual semiconductor lasers 2. Therefore, as shown in FIG. 5, the initial drive current value at each temperature for each semiconductor laser 2 is measured and stored in memory unit (EPROM or EEPROM) 24 and used in combination with this semiconductor laser 2.

The drive current measuring unit 20 and the temperature measuring unit 21 always measure, respectively, the drive current and temperature of the semiconductor laser 2, and the detection unit 22 periodically picks up the measured drive current value and temperature and compares the measured drive current value with the initial drive current value corresponding to the measured temperature. The warning unit 23 generates an alarm based on a prediction of the expiration of the service life of the semiconductor laser 2, when the drive current value exceeds the initial drive current value by as much as the specified percentage (for example, 20% as shown by current lfe in FIG. 6). Note, since the semiconductor laser 2 still operates at this timing, the work will not be hindered when the semiconductor laser 2 and the memory unit 24 are replaced during an appropriate time zone.

Figure 7A:
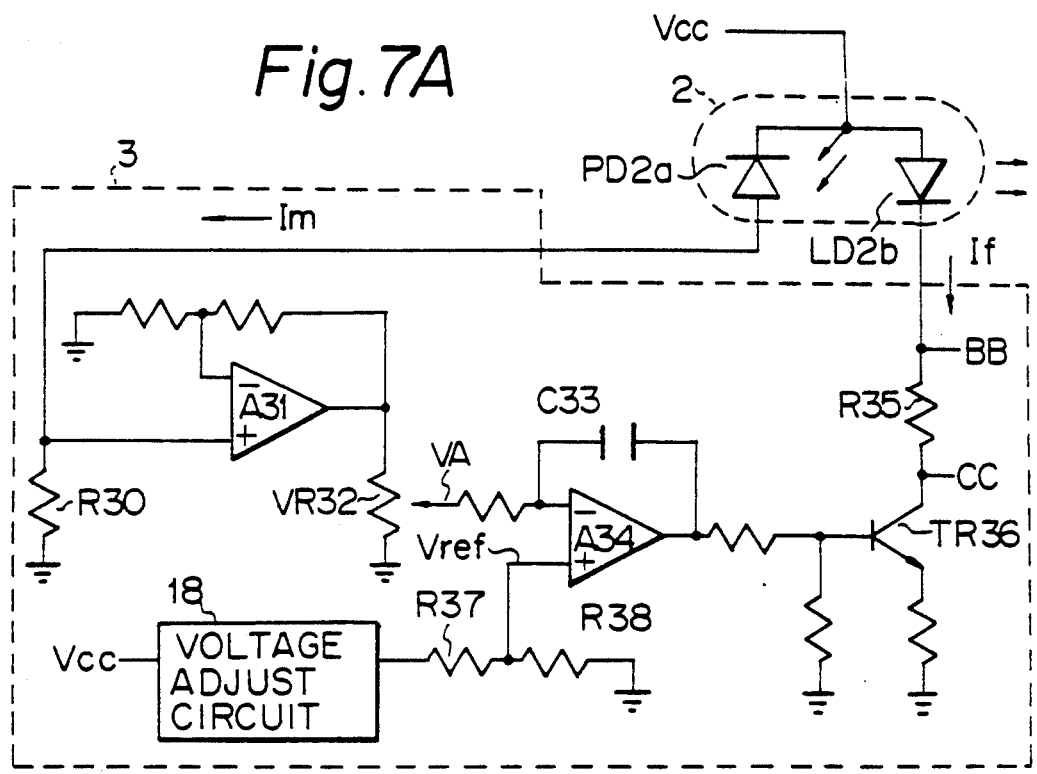
FIGS. 7A and 7B are circuit block diagrams showing a first embodiment of a semiconductor laser control apparatus according to the present invention.
Figure 7B:
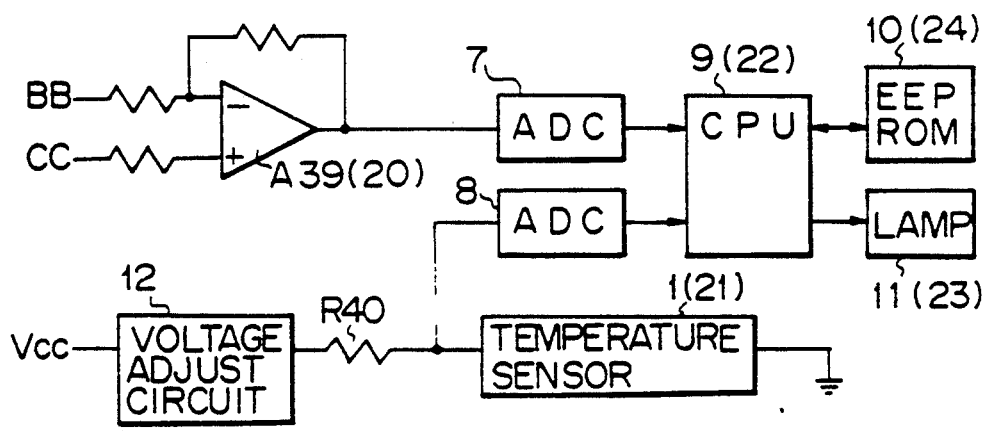

FIGS. 7A and 7B show a first embodiment of a semiconductor laser control apparatus according to the present invention. Note this first embodiment shows an example of a configuration of the semiconductor laser control apparatus which always continuously lights up, and an example of warning of the expiration of service life by a lamp indication. Namely, the semiconductor laser control circuit 3 has the same configuration as in FIG. 2A, except that the analog switch ANSW 117 in FIG. 2A (or equivalent to the OFF state of the analog switch ANSW 117) is omitted so that the same continuous lighting control is performed as when the analog switch ANSW 117 is switched OFF.

As shown in FIG. 7A, the semiconductor laser 2 comprises a laser diode (LD) 2b and a photo diode (PD) 2a, and a drive current If of the laser diode 2b is controlled by a current Im of the photo diode 2a, corresponding to the light quantity of the laser diode 2b which is detected by the photo diode 2a, to maintain the light quantity of the semiconductor laser 2 at a fixed level.

In the semiconductor laser control circuit 3, the current Im is converted to a voltage by a resistor R30 and amplified by an operation amplifier A31, and then divided to a voltage VA corresponding to the specified light quantity by a variable resistor VR32. The voltage VA is compared with a reference voltage Vref generated from a voltage adjust circuit 18, resistors R37 and R38, and integrated by an operation amplifier A34. Further, the voltage VA after integration by the operation amplifier A34 is converted to the laser drive current If by the transistor TR36. Note, C33 denotes a capacitor connected between a negative input terminal and an output terminal of the operation amplifier A34.

As shown in FIG. 7B, reference numerals 7, 8 denote analog to digital converters (ADCs), 9 denotes a central processing unit (CPU), 10 denotes an EEPROM, 11 denotes a lamp, 12 denotes a voltage adjust circuit, 1 denotes a temperature sensor, and A39 denotes an operation amplifier. Comparing FIGS. 5 and 7B, the operation amplifier A39 and the ADC 7 correspond to the drive current measuring unit 20, the temperature sensor 1 and the ADC 8 correspond to the temperature measuring unit 21, the CPU 9 corresponds to the detection unit 22, the lamp 11 corresponds to the warning unit 23, and the EEPROM 10 corresponds to memory unit 24.

Note, the ADC 7 is used to convert an output voltage of the operation amplifier A39 to a digital signal, and the converted digital signal is supplied to the CPU 9. Similarly, the ADC 8 is used to convert a voltage of the temperature sensor 1 to a digital signal, and the converted digital signal is supplied to the CPU 9. Further, as described above, the EEPROM 10 may be constituted by an EPROM. In addition, as shown in FIGS. 7A and 7B, both ends BB and CC of the resistor R35 are connected to input terminals of the operating amplifier A39. Namely, a potential caused by the resistor R35 is applied to the operation amplifier A39 to measure the drive current If of the semiconductor laser 2.

The EEPROM 10 stores the corresponding initial drive current value of the semiconductor laser 2 in relation to the temperature. Note, the EEPROM 10 generally stores a plurality of initial drive current values corresponding to various temperatures. Nevertheless, the EEPROM 10 can store only one initial drive current value of a specific temperature, and other initial drive currents corresponding to various temperatures can be calculated by using the stored initial drive current value of the specific temperature. -In this case, the accuracy of the initial drive currents calculated by using the stored initial drive current value may decrease.

The semiconductor laser 2 is put in advance in a thermostatic oven, which is set to respective temperatures, and a drive current (initial drive current), from which the specified light quantities can be respectively obtained, is measured.

In the above described configuration, the following detection is carried out.

The CPU 9 picks up a drive current value (actual drive current value) and a temperature from the outputs of the ADC 7 and the ADC 8 at a specified time interval, and further, the CPU 9 picks up the initial drive current corresponding to the temperature from the EEPROM 10. Further, the CPU 9 compares the actual drive current value with the initial drive current corresponding to the detected temperature, and it is determined whether the actual drive current value exceeds the specified percentage (for example, 20%) and the initial drive current value at that temperature is verified. Consequently, when it is determined that the actual drive current value exceeds the specified percentage, the initial drive current value, the lamp 11 lights up to indicate the near expiration of the service life of the semiconductor laser 2, and a new semiconductor laser and an EEPROM 10 thereof are replaced.

FIG. 8 is a flow chart showing an example of a laser control operation carried out in the semiconductor laser control apparatus according to the present invention. Note, in the laser control operation shown in FIG. 8, only one initial drive current ($I_{ref}$) of the semiconductor laser (2) at a reference temperature $T_{ref}$ (for example, 25° C., or 35° C.) is measured and stored in the EEPROM (10, 24). Further, in FIG. 8, reference T denotes a temperature (actual temperature) of the semiconductor laser 2, $\Delta I$ denotes a temperature compensation value (for example, 1 mA/° C.), and $I_{lim}$ (T) denotes a limit drive current of the semiconductor laser 2 at the actual temperature T. For example, $I_{lim}$ (T) is determined to be a value 20% larger than the initial drive current value $I_{ref}$.

First, in Step 81, an actual temperature T of the semiconductor laser 2 is measured by the temperature sensor 1 (temperature measuring unit 21), and the flow proceeds to Step 82. In Step 82, it is determined whether the actual temperature T of the semiconductor laser 2 is larger than a value $(T_{ref}+5)$° C., and then in Step 83, it is determined whether the actual temperature T of the semiconductor laser 2 is smaller than a value $(T_{ref}-5)$° C. Namely, in Steps 82 and 83, when the actual temperature T of the semiconductor laser 2 is included in the temperature range from $(T_{ref}-5)$° C. to $(T_{ref}+5)$° C., the flow proceeds to Step 84, and in the other cases, the flow returns to Step 81.

In Step 84, a limit drive current $I_{lim}$ (T) of the semiconductor laser 2 is calculated by the following equation (1), and then the flow proceeds to Step 85.

$$I_{lim}(T) = (\Delta I \times (T - T_{ref}) + I_{ref}) \times 1.2 \qquad (1)$$

Note, in the above equation (1), $I_{lim}$(T) is determined to be a value 20% larger than the initial drive current value $I_{ref}$ at the actual temperature.

Further, in Step 85, an actual drive current Iop (If) is measured by the drive current measuring unit 20, and the flow proceeds to Step 86 wherein it is determined whether the limit drive current $I_{lim}$ (T) of the semiconductor laser 2 is larger than the actual drive current Iop. In Step 86, when it is determined that the limit drive current $I_{lim}$ (T) is not larger than the actual drive current Iop, the flow proceeds to Step 87, and when it is determined that the limit drive current $I_{lim}$ (T) is larger than the actual drive current Iop, the flow returns to Step 81. Note, in Step 87, a predetermined laser expiration operation is carried out. Namely, in Step 87, for example, a lamp 11 lights up to indicate the near expiration of the service life of the semiconductor laser 2, or a specified message showing the service life of the semiconductor laser 2 has expired is indicated on the POS system. Consequently, a new semiconductor laser and an EEPROM thereof are replaced.

Note, data stored in the memory unit 24 and the calculation manner for obtaining the initial current value at the actual temperature can be modified.

Figure 9A:
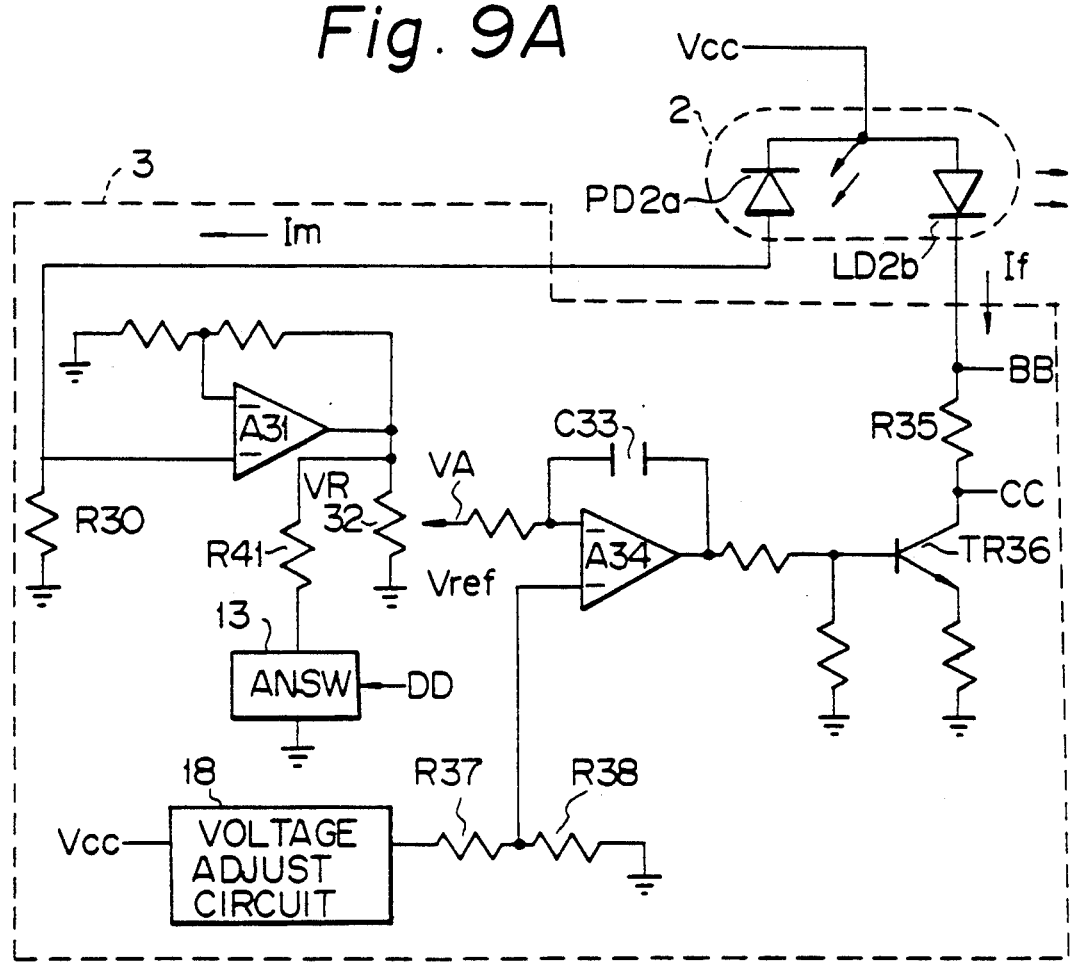
FIGS. 9A and 9B are circuit block diagrams showing a second embodiment of a semiconductor laser control apparatus according to the present invention.
Figure 9B:
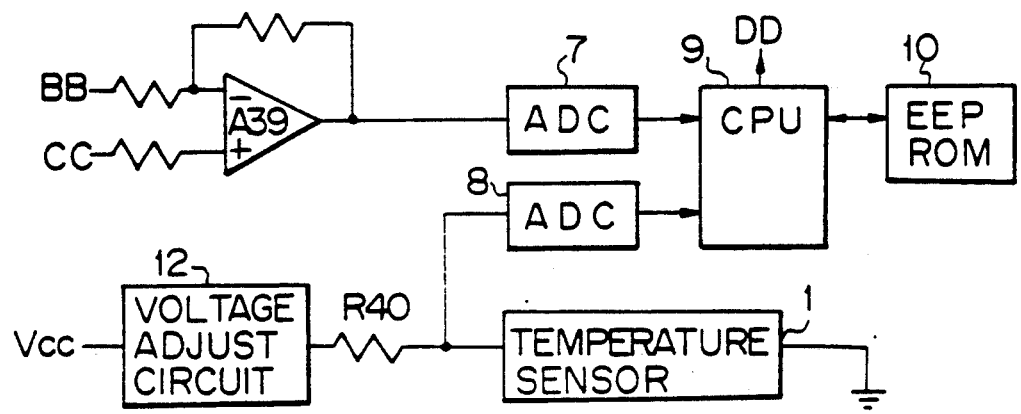

FIGS. 9A and 9B show a second embodiment of a semiconductor laser control apparatus according to the present invention. Note, in the second embodiment of the present invention, the drive current is reduced to prolong the service life of the semiconductor laser 2 after the near expiration of the service life has been detected in the first embodiment shown in FIGS. 7A and 7B.

The semiconductor laser control circuit 3 shown in FIG. 9A is the same as shown in FIG. 7A except for an analog switch (ANSW) 13 and a resistor R41, which are additionally provided and carry out the same lighting control and detection. Note, the analog switch 13 and the resistor R41 are connected parallel to the variable resistor VR32, and when the analog switch 13 is switched ON, a specified light quantity is obtained. Namely, in the second embodiment, the CPU 9 detects the near expiration of service life of the semiconductor laser 2, the switching control signal DD is output from the CPU 9 to the analog switch 13, the analog switch 13 is switched OFF, and the voltage value VA is increased and the drive current If and the light quantity is reduced. Consequently, the subsequent service life of the semiconductor laser 2 can be extended.

As described above, in the second embodiment of the semiconductor laser control apparatus, when the near expiration of service life of the semiconductor laser is detected, the drive current of the semiconductor laser 2 is decreased. Namely, though the light quantity is reduced and the operation efficiency deteriorates by the above operation, the subsequent operation time until failure of operation can be extended.

Figure 10A:
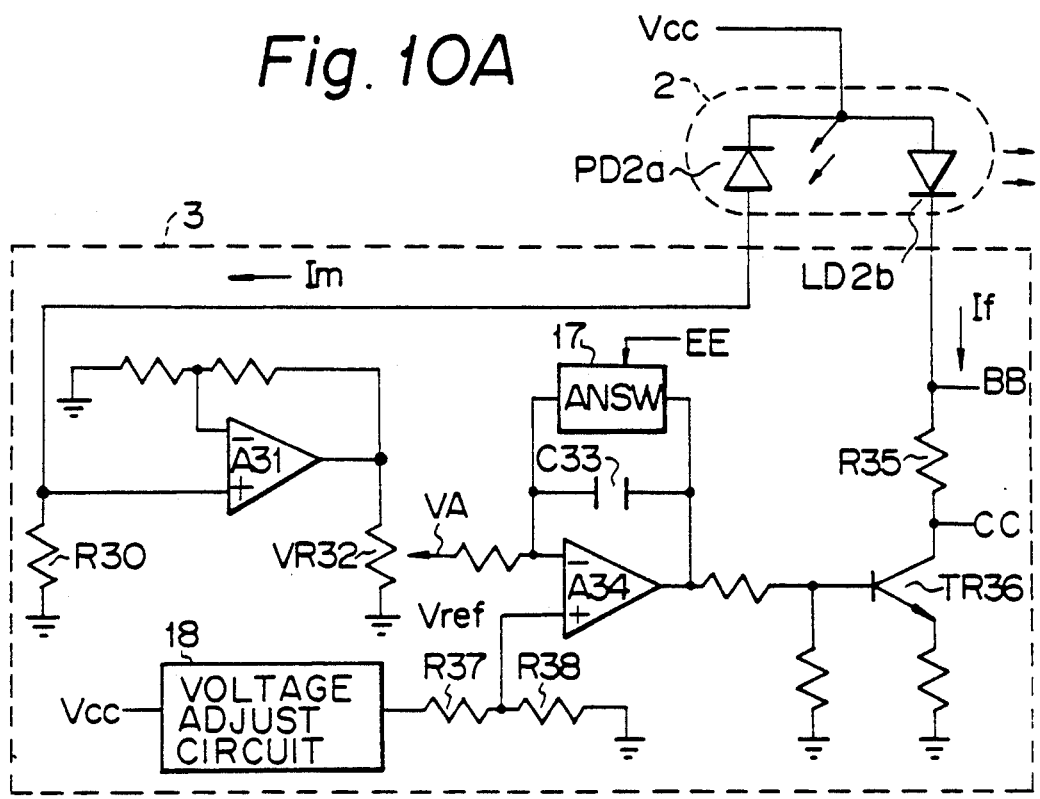
FIGS. 10A and 10B are circuit block diagrams showing a third embodiment of a semiconductor laser control apparatus according to the present invention.
Figure 10B:
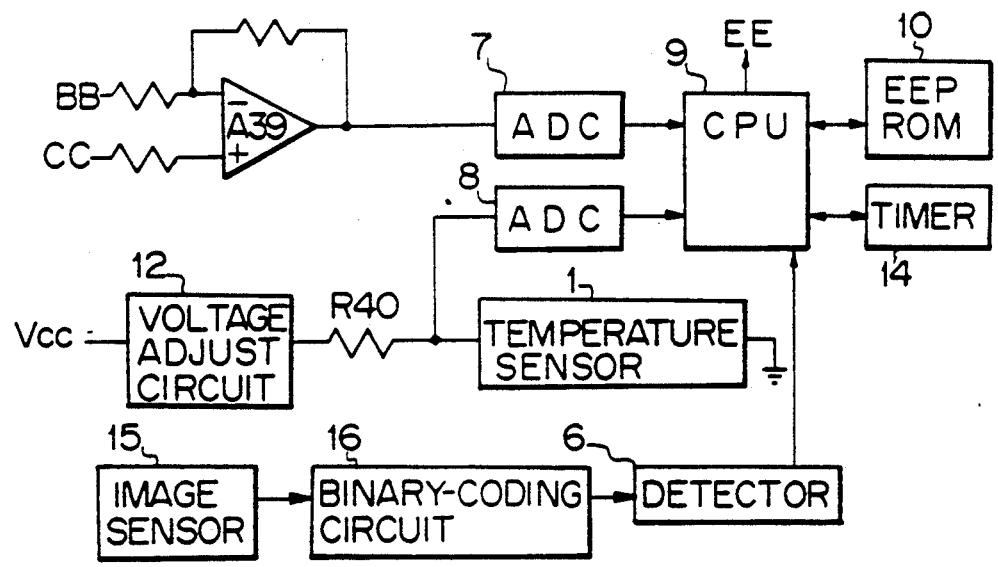

FIGS. 10A and 10B show a third embodiment of a semiconductor laser control apparatus according to the present invention, wherein a reference numeral 14 denotes a timer, reference numeral 15 denotes an image sensor, reference numeral 16 denotes a binary-coding circuit and reference numeral 6 denotes a detector. Note, in the third embodiment of the present invention, the semiconductor laser control apparatus controls lighting and extinguishing operations in the second mode (dm2) and the third mode (dm3) described in the prior art, when it is not used.

As shown in FIGS. 4, 10A and 10B, the CPU 20% as shown by current lfe in FIG. 6) the time (dmT1) in continuous lighting (the first mode dm1) to the first time, for example, 5 seconds, and changes the time to the second time (dmT2), that is, 2 seconds according to the timer 14, when the near expiration of service life of the semiconductor laser is detected. Therefore, the continuous lighting time is shortened, and thus the subsequent operation time until the failure of operation can be extended.

As described above, in the third embodiment of the semiconductor laser control apparatus which repeats lighting and extinguishing operations of the semiconductor laser 2 at the specified ratio, continuously lights up the semiconductor laser 2 when the start of reading is detected, and repeats lighting and extinguishing operations at the above described ratio when the next reading is not started even after a lapse of the first time from the detection timing, the time setting is changed from the first time to a shorter second time shorter when the expiration of the service life is detected. Therefore, the continuous lighting time is reduced and the subsequent operation time until failure of operation can be extended.

Figure 11A:
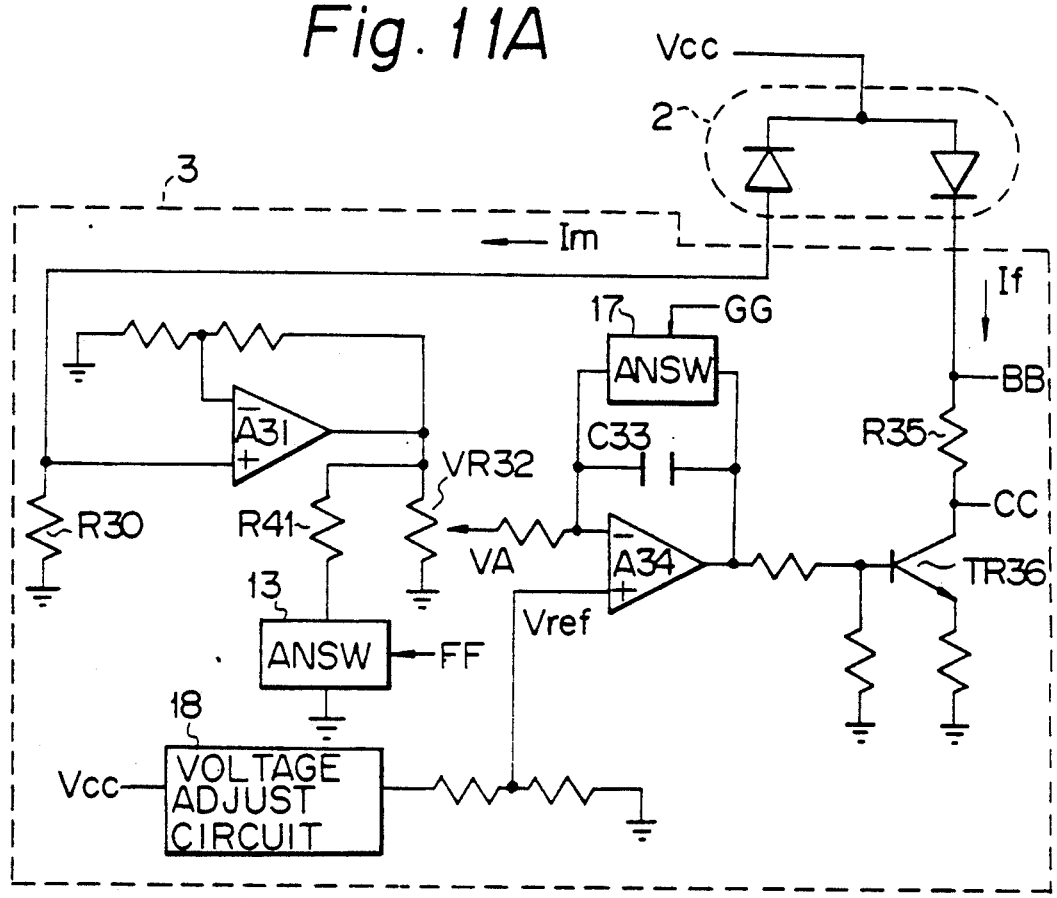
FIGS. 11A and 11B are circuit block diagrams showing a fourth embodiment of a semiconductor laser control apparatus according to the present invention.
Figure 11B:
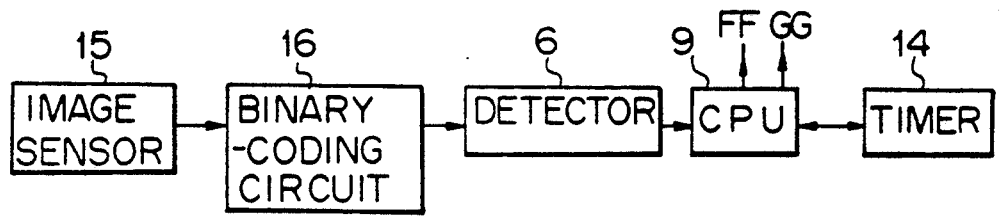
Figure 12:
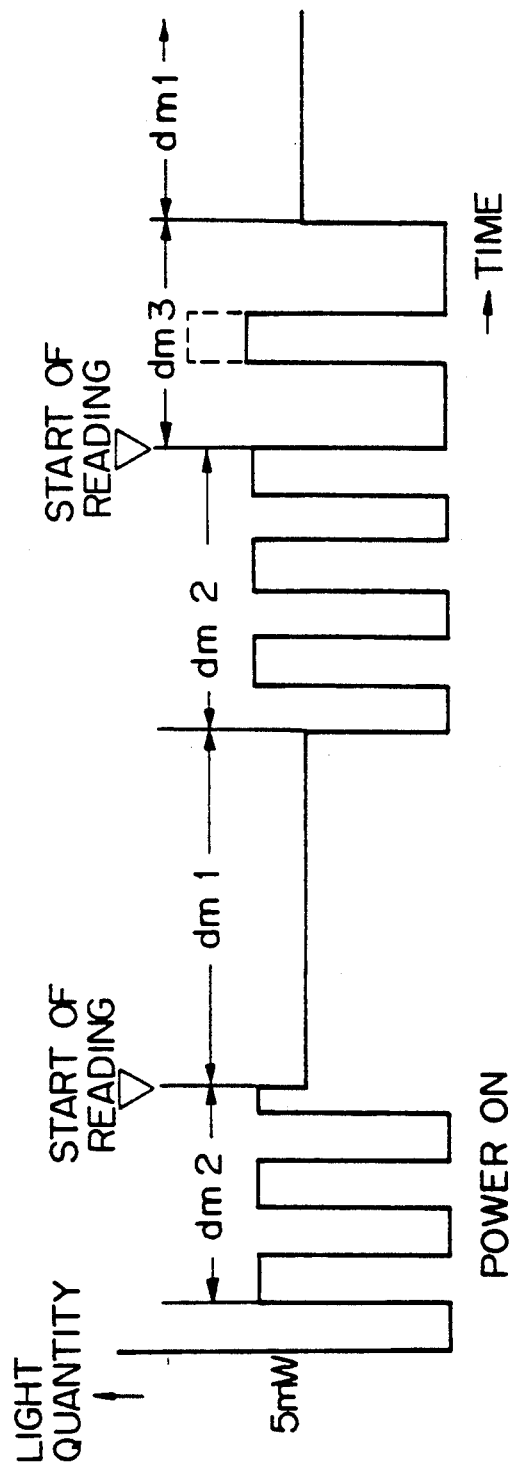
FIG. 12 is a timing chart for explaining a laser control operation in the semiconductor laser control apparatus of FIGS. 11A and 11B.

FIGS. 11A and 11B show a fourth embodiment of a semiconductor laser control apparatus according to the present invention, and FIG. 12 is a timing chart for explaining a laser control operation in the semiconductor laser control apparatus of FIGS. 11A and 11B.

By the way, in a bar code reader of a POS system, the semiconductor laser is used for lighting up a bar code label provided on each of the various goods, and the contents (information) of the bar code are read out by an image sensor which detects a reflected light (laser) from the bar code. In the case that various goods are passed through the bar code reader to read out the contents of the bar code, the laser also shines onto the face of an operator. Note, in general, it is not preferable to shine a large amount of laser beam (laser energy) into the eyes of an operator of the POS system, and thus, a total amount of laser energy input into the eyes of the operator must be limited to a specific value to protect the operator.

In the fourth embodiment of the present invention, the semiconductor laser control apparatus controls lighting and extinguishing as described in the prior art example with reference to FIGS. 1 to 4. Namely, as shown in FIG. 12, when a bar code label is scanned in the second mode dm2 or the third mode dm3, the detection of bar code information is delayed and the changeover to the first mode dm1 for continuous lighting may also be delayed, and therefore operation efficiency will deteriorate.

This fourth embodiment is intended to provide an improvement in this point, and specifically, the light quantity of the semiconductor laser 2 is increased in the second mode dm2 and the third mode dm3, and the detectable range (area) is expanded. Note, in the cases of the second mode dm2 and the third mode dm3, the total amount of laser energy input into the eyes of an operator is lower than a specific value to protect the operator. Because, in the second mode dm2 and the third mode dm3, a light quantity (output power) of the semiconductor laser 2 is increased but the semiconductor laser 2 is repetitively lighted and extinguished.

The configuration of the semiconductor laser control apparatus shown in FIGS. 11A and 11b is a similar configuration of FIGS. 2A and 2B, wherein a resistor R41 and an analog switch (ANSW) 13 are added. Note, the variable resistor VR32 is adjusted in advance by setting the analog switch 17 to switch OFF and the analog switch 13 to switch OFF. Note, the analog switch 13 is controlled by a switch control signal FF output from the CPU 9, and further, the analog switch 17 is controlled by a switch control signal GG output from the CPU 9.

The CPU 9 controls the analog switch 13 to switch OFF in the first mode md1, and the analog switch 13 to switch ON in the second mode dm2 and the third mode dm3. Therefore, the light quantity increases in the second mode dm2 and the third mode dm3 as shown in FIG. 12 and the detection distance is extended. Note, as shown by a broken line of the third mode dm3 of FIG. 12, the light quantity of the semiconductor laser 2 in the third mode dm3 can be determined to be a larger value than that of the second mode dm2, since a percentage of lighting (ON state) of the semiconductor laser 2 in the third mode dm3 is lower than that of the second mode dm2.

The fourth embodiment can apply to the third embodiment. In this case, a resistor (41) and an analog switch (13) can be connected parallel to the variable resistor VR32 and ON/OFF control can be carried out. In the fourth embodiment of the semiconductor laser control apparatus, the light quantity in repeating lighting and extinguishing operations increases and the distance along which an object (bar code label provided on an article) to be irradiated can be identified, and thus the changeover to continuous lighting is expected and the operation efficiency is improved.

As described above with reference to FIGS. 5 to 12, the present invention is constituted to generate an alarm by predicting the service life of the semiconductor laser and extend the time before the apparatus fails to operate by detecting the near expiration of the service life and therefore ensure the operational effects, such as replacement of the semiconductor laser, without inconveniencing operation. Further, the semiconductor laser control apparatus according to the present invention can be provided for a bar code reader and a POS system, and also provided for various kinds of laser devices using a semiconductor laser.

Many widely differing embodiments of the present invention may be constructed without departing from the spirit and scope of the present invention, and it should be understood that the present invention is not limited to the specific embodiments described in this specification, except as defined in the appended claims.

We claim:

1. A semiconductor laser control apparatus comprising:
   a semiconductor laser;

a semiconductor laser control circuit, coupled to said semiconductor laser, for controlling a drive current of said semiconductor laser so that a specific light quantity is output from said semiconductor laser;

drive current measuring means for measuring an actual drive current of said semiconductor laser;

temperature measuring means for measuring an actual temperature of said semiconductor laser;

memory means for storing at least one initial drive current value of said semiconductor laser for the specific light quantity and corresponding temperature of said at least one initial drive current value;

detection means for comparing the actual drive current value of said semiconductor laser measured by said drive current measuring means with the at least one initial drive current value corresponding to the actual temperature when the actual drive current is measured; and warning means for generating an alarm predicting the expiration of service life of said semiconductor laser, when the actual drive current value exceeds the corresponding at least one initial drive current value by a specified percentage.

2. A semiconductor laser control apparatus as claimed in claim 1, wherein said memory means stores a plurality of initial drive current values of said semiconductor laser and respectively corresponding temperatures.

3. A semiconductor laser control apparatus as claimed in claim 1, wherein said memory means stores one initial drive current value of said semiconductor laser and a corresponding temperature.

4. A semiconductor laser control apparatus as claimed in claim 1, wherein said memory means is constituted by an EEPROM or EPROM.

5. A semiconductor laser control apparatus as claimed in claim 1, wherein said semiconductor laser and said memory means are provided in the same package.

6. A semiconductor laser control apparatus as claimed in claim 1, wherein said detection means includes:

first drive means for controlling the lighting to obtain a first light quantity; and second drive means for controlling the lighting to obtain a second light quantity which is less than the first light quantity, said second drive means switching control from said first drive means to said second drive means, when the actual drive current value is increased by a specified percentage over the corresponding initial current value while the lighting is controlled by said first drive means.

7. A semiconductor laser control apparatus as claimed in claim 1, wherein said semiconductor laser control apparatus repeats switching ON and OFF of said semiconductor laser at a specified ratio, continuously remains on when specified information is detected in reflected light from an object to be radiated and repeats lighting and extinguishing at the specified ratio when the specified information is not detected even after a first time is passed from an information detection timing, and wherein a time setting is changed from the first time to a second time shorter than the first time when the actual drive current value is increased by a specified percentage over the initial drive current value at the corresponding temperature.

8. A semiconductor laser control apparatus which repeatedly lights and extinguishes a semiconductor laser at a specified ratio, which continuously remains on when specified information is detected in a reflected light from an object to be radiated, and which repeatedly lights and extinguishes at the specified ratio when the specified information is not detected even after the specified time has passed from said information detection timing, said semiconductor laser control apparatus comprising:

first drive means for controlling the lighting of said semiconductor laser to obtain a first light quantity;

second drive means for controlling the lighting of said semiconductor laser to obtain a second light quantity larger than the first light quantity; and control means for controlling the lighting by said first drive means for continuous lighting and changing over to said second drive means for repeated lighting and extinguishing.

9. A semiconductor laser control apparatus as claimed in claim 8, wherein said semiconductor laser control apparatus comprises:

a semiconductor laser control circuit for controlling a drive current of said semiconductor laser to output the first or second light quantity from said semiconductor laser;

drive current measuring means for measuring an actual drive current value of said semiconductor laser;

temperature measuring means for measuring an actual temperature of said semiconductor laser;

memory means for storing at least one initial drive current value of said semiconductor laser for the first light quantity and a corresponding temperature of the at least one initial drive current value;

detecting means for comparing the actual drive current value of said semiconductor laser measured by said drive current measuring means with the initial drive current value corresponding to the actual temperature when the actual drive current value is measured; and warning means for generating an alarm predicting the expiration of service life of said semiconductor laser, when the actual drive current value exceeds the corresponding at least one initial drive current value by a specified percentage.

10. A semiconductor laser control apparatus as claimed in claim 9, wherein said memory means stores a plurality of initial drive current values of said semiconductor laser and respectively corresponding temperatures.

11. A semiconductor laser control apparatus as claimed in claim 9, wherein said memory means stores one initial drive current value of said semiconductor laser and a corresponding temperature.

12. A semiconductor laser control apparatus as claimed in claim 9, wherein said memory means is constituted by an EEPROM or EPROM.

13. A semiconductor laser control apparatus as claimed in claim 9, wherein said semiconductor laser and said memory means are provided in the same package.

14. A semiconductor laser control apparatus as claimed in claim 8, wherein said semiconductor laser control apparatus repeats switching ON and OFF of said semiconductor laser at the specified ratio, continuously remains on when specified information is detected in reflected light from an object to be radiated and repeats lighting and extinguishing at the specified ratio when the specified information is not detected even after a first time is passed from an information detection timing, and wherein a time setting is changed from the first time when the actual drive current value is increased by a specified percentage over the initial drive current value at the corresponding temperature.

15. A bar code reader device, for reading data from a bar code label and supplying the data to a point-of-sale terminal, having a semiconductor laser control apparatus, said semiconductor laser control apparatus comprising:

a semiconductor laser;

a semiconductor laser control circuit, coupled to said semiconductor laser, for controlling a drive current of said semiconductor laser so that a specific light quantity is output from said semiconductor laser;

drive current measuring means for measuring an actual drive current of said semiconductor laser;

temperature measuring means for measuring an actual temperature of said semiconductor laser;

memory means for storing at least one initial drive current value of said semiconductor laser for the specific light quantity and corresponding temperature of said at least one initial drive current value;

detecting means for comparing the actual drive current value of said semiconductor laser measured by said drive current measuring means with the at least one initial drive current value corresponding to the actual temperature when the actual drive current is measured; and warning means for generating an alarm predicting the expiration of service life of said semiconductor laser, when the actual drive current value exceeds the corresponding at least one initial drive current value by a specified percentage.

16. A bar code reader device as claimed in claim 15, wherein said memory means stores a plurality of initial drive current values of said semiconductor laser and respectively corresponding temperatures.

17. A bar code reader device as claimed in claim 15, wherein said memory means stores one initial drive current value of said semiconductor laser and a corresponding temperature.

18. A bar code reader device as claimed in claim 15, wherein said memory means is constituted by an EEPROM or EPROM.

19. A bar code reader device as claimed in claim 15, wherein said semiconductor laser and said memory means are provided in the same package.

20. A bar code reader device as claimed in claim 15, wherein said detection means includes:

first drive means for controlling the lighting to obtain a first light quantity; and second drive means for controlling the lighting to obtain a second light quantity which is less than the first light quantity, said second drive means switching control from said first drive means to said second drive means, when the actual drive current value is increased by a specified percentage over the corresponding initial current value while the lighting is controlled by said first drive means.

21. A bar code reader device as claimed in claim 15, wherein said semiconductor laser control apparatus repeats switching ON and OFF of said semiconductor laser at a specified ratio, continuously remains on when specified information is detected in reflected light from an object to be radiated and repeats lighting and extinguishing at the specified ratio when the specified information is not detected even after a first time is passed from an information detection timing, and wherein a time setting is changed from the first time to a second time shorter than said first time when the actual drive current value is increased by a specified percentage over the initial drive current value at the corresponding temperature.

22. A bar code reader device, for reading the data of a bar code label and supplying the data to a point-of-sale terminal, having a semiconductor laser control apparatus which repeatedly lights and extinguishes a semiconductor laser at a specified ratio, which continuously remains on when specified information is detected in a reflected light from an object to be radiated, and which repeatedly lights and extinguishes at the specified ratio when the specified information is not detected even after the specified time has passed from said information detection timing, said semiconductor laser control apparatus comprising:

first drive means for controlling the lighting of said semiconductor laser to obtain a first light quantity;

second drive means for controlling the lighting of said semiconductor laser to obtain a second light quantity larger than the first light quantity; and control means for controlling the lighting by said first drive means for continuous lighting and changing over to said second drive means for repeated lighting and extinguishing.

23. A bar code reader device as claimed in claim 22, wherein said semiconductor laser control apparatus comprises:

a semiconductor laser control circuit for controlling a drive current of said semiconductor laser to output the first or second light quantity from said semiconductor laser;

drive current measuring means for measuring an actual drive current value of said semiconductor laser;

temperature measuring means for measuring an actual temperature of said semiconductor laser;

memory means for storing at least one initial drive current value of said semiconductor laser for the first light quantity and a corresponding temperature of the at least one initial drive current value;

detection means for comparing the actual drive current value of said semiconductor laser measured by said drive current measuring means with the initial drive current value corresponding to the actual temperature when the actual drive current is measured; and warning means for generating an alarm predicting the expiration of service life of said semiconductor laser, when the actual drive current value exceeds the corresponding at least one initial drive current value by a specified percentage.

24. A bar code reader device as claimed in claim 23, wherein said memory means stores a plurality of initial drive current values of said semiconductor laser and respectively corresponding temperatures.

25. A bar code reader device as claimed in claim 23, wherein said memory means stores one initial drive current value of said semiconductor laser and a corresponding temperature.

26. A bar code reader device as claimed in claim 23, wherein said memory means is constituted by an EEPROM or EPROM.

27. A bar code reader device as claimed in claim 23, wherein said semiconductor laser and said memory means are provided in the same package.

28. A bar code reader device as claimed in claim 22, wherein said semiconductor laser control apparatus repeats switching ON and OFF of said semiconductor laser at the specified ratio, continuously remains on when specified information is detected in reflected light from an object to be radiated and repeats lighting an extinguishing at the specified ratio when the specified information is not detected ever after a first time is passed from an information detection timing, and wherein a time setting is changed from the first time to a second time shorter than the first time when the actual drive current value is increased by a specified percentage over the initial drive current value at the corresponding temperature.

29. A semiconductor laser control apparatus comprising:

a semiconductor laser driven by a drive current;

means for determining the actual drive current of said semiconductor laser;

means for determining an actual temperature of said semiconductor laser; and means for predicting the expiration of service life of said semiconductor laser based on the actual drive current value, the actual temperature and a corresponding at least one initial drive current value for a predetermined light quantity and corresponding temperature.

30. A semiconductor laser control apparatus as claimed in claim 29, further comprising:

first means for controlling said semiconductor laser to produce a first light quantity; and second means for controlling said semiconductor laser to produce a second light quantity which is less than the first light quantity when the actual drive current value is increased by a specified percentage over the corresponding at least one initial current value while said first means is controlling said semiconductor laser.

* * * * *

UNITED STATES PATENT AND TRADEMARK OFFICE
CERTIFICATE OF CORRECTION

Page 1 of 2

PATENT NO. : 5,334,826
DATED : AUGUST 2, 1994
INVENTOR(S) : Shinichi SATO, et al.

It is certified that error appears in the above-indentified patent and that said Letters Patent is hereby corrected as shown below:

TITLE PAGE [57] ABSTRACT, line 10, "performing" should be --performs--.

Col. 1, line 27, "inoperatable" should be --inoperative--;
line 37, "hour" should be --hours)--;
line 51, "NO." should be --No.--;
line 55, "JPPA,606." should be --JPA '606.--.

Col. 2, line 2, "initial drive" should be --initial set of drive--.

*Col. 3, line 32, "ON" should be --ON when--.

Col. 8, line 16, "lfe" should be --Ife--.

Col. 11, line 14, "20% as" should be deleted;
line 15, "shown by current lfe in FIG. 6)" should be --9 provides a signal EE to analog switch 17 and sets--.

UNITED STATES PATENT AND TRADEMARK OFFICE
CERTIFICATE OF CORRECTION

PATENT NO. : 5,334,826
DATED : AUGUST 2, 1994
INVENTOR(S) : Shinichi SATO, et al.

It is certified that error appears in the above-indentified patent and that said Letters Patent is hereby corrected as shown below:

Col. 12, line 12, "lib" should be --11B--.

Col. 15, line 27, "detecting" should be --detection--.

Col. 17, line 10, "an" should be --and--;
line 12, "ever" should be --even--.

Signed and Sealed this

Fourteenth Day of February, 1995

Attest:

BRUCE LEHMAN

Attesting Officer        Commissioner of Patents and Trademarks